United States Patent [19]

Matsui et al.

[11] Patent Number: 5,141,579
[45] Date of Patent: Aug. 25, 1992

[54] PRODUCING SI$_3$N$_4$ COMPOSITE MATERIAL BY SHEETING A MIXTURE OF SI$_3$N$_4$ POWDER AND METAL OXIDE COATED SIC WHISKERS WITH A DOCTOR BLADE TO PREPARE SEVERAL GREEN SHEETS, ORIENTING AND LAMINATING THE GREEN SHEETS, AND SINTERING THE LAMINATE

[75] Inventors: Tatsuji Matsui; Osamu Komura; Masaya Miyake, all of Hyogo, Japan

[73] Assignee: Sumitomo Electric Industries, Ltd., Osaka, Japan

[21] Appl. No.: 648,762

[22] Filed: Jan. 31, 1991

[30] Foreign Application Priority Data

Jan. 31, 1990 [JP] Japan .................................. 2-21618
Feb. 21, 1990 [JP] Japan .................................. 2-40676
Apr. 6, 1990 [JP] Japan .................................. 2-91523

[51] Int. Cl.$^5$ .......................... C04B 33/36; B05D 3/02
[52] U.S. Cl. ...................................... 156/89; 427/217; 427/376.3; 427/383.3; 427/419.2; 427/443.2; 264/212; 501/95; 501/96
[58] Field of Search ............... 427/249, 419.2, 419.7, 427/217, 376.3, 383.3, 443.2; 501/95, 96; 264/212; 156/89

[56] References Cited

U.S. PATENT DOCUMENTS

4,994,418 2/1991 Yamakawa et al. ................. 501/95

FOREIGN PATENT DOCUMENTS

0221764 5/1987 European Pat. Off. .
0268721 6/1988 European Pat. Off. .
62-216970 9/1917 Japan .
62-216969 9/1987 Japan .
62-230680 10/1987 Japan .
1-133981 5/1989 Japan .

OTHER PUBLICATIONS

Periodic Table at the Elements–from CRC Handbook of Chemistry and Physics–CRC Press 63rd ed.
Journal of Materials Science Letters, vol. 6, no. 11, pp. 1356-1358, "SiC whisker reinforced Si$_3$N$_4$ composites".
Chemical Abstracts, vol. 112, no. 2, abstract no. 11027w.

*Primary Examiner*—Shrive Beck
*Assistant Examiner*—Benjamin L. Utech
*Attorney, Agent, or Firm*—Sughrue, Mion, Zinn, Macpeak & Seas

[57] ABSTRACT

An SiC whisker-reinforced Si$_3$N$_4$ composite material comprising a sintered body of an Si$_3$N$_4$ matrix having dispersed therein SiC whiskers, wherein said SiC whiskers are uniaxially orientated; a process for producing an SiC whisker-reinforced Si$_3$N$_4$ composite material which comprises mixing (1) SiC whiskers having a coating comprising an oxide of at least one metallic element selected from the group consisting of Be, Mg, Ca, Sr, and Ba of the group 2A; Sc, Y, and La of the group 3A; Ti, Zr, and Hf of the group 4A; and Li, Al, and Si with (2) Si$_3$N$_4$ powder, and sintering the mixture; and a process for forming said metal oxide coating on the surface of whiskers which comprises dipping whiskers in a solution of an inorganic or organic salt of at least one metallic element selected from the group consisting of the elements of the groups 2A, 3A, and 4A of the periodic table, Li, and Al and heat treating the whiskers having adhered thereto the metallic salt at a temperature not less than the thermal decomposition temperature of said metallic salt. The SiC whisker-reinforced Si$_3$N$_4$ composite material exhibits improved strength particularly at high temperatures and improved toughness.

2 Claims, No Drawings

PRODUCING SI₃N₄ COMPOSITE MATERIAL BY SHEETING A MIXTURE OF SI₃N₄ POWDER AND METAL OXIDE COATED SIC WHISKERS WITH A DOCTOR BLADE TO PREPARE SEVERAL GREEN SHEETS, AND SINTERING THE LAMINATE

FIELD OF THE INVENTION

This invention relates to an SiC whisker-reinforced $Si_3N_4$ composite material having high strength and high toughness suited for use as automobile engine parts or various structural materials and a process for producing the same. The invention also relates to a process for forming a metal oxide coating on the surface of whiskers useful as a reinforcement in ceramic composite materials.

BACKGROUND OF THE INVENTION

With the recent spread of application of ceramics to mechanical structural parts, such as automobile engines, it has been demanded to overcome brittleness inherent to ceramics to develop highly tough and reliable ceramic materials.

Silicon nitride ($Si_3N_4$)-based ceramics mainly comprising $Si_3N_4$ are excellent in strength at room temperature, oxidation resistance, abrasion resistance, thermal impact resistance, corrosion resistance, etc., and have been put into practical use as cutting tools or automobile parts.

In the latest developments of high efficiency engines, use of $Si_3N_4$ as a high-temperature resistant material has been attempted. There has been a need, to this effect, to achieve further improvements in toughness and high-temperature strength at 1200° C. or higher.

It is known that toughness of $Si_3N_4$ can be improved by dispersing reinforcing SiC whiskers in a matrix of $Si_3N_4$ to obtain a composite material as proposed in JP-A-62-265173 (the term "JP-A" as used herein means an "unexamined published Japanese patent application"). However, whisker-reinforced composite materials produced by conventional processes do not show an appreciable improvement in toughness which would have been brought about by the reinforcement. That is, high-temperature strength of the state-of-the-art whisker-reinforced composite materials is higher than that of an $Si_3N_4$ single phase but is still lower than their room-temperature strength.

An improvement in toughness brought about by reinforcing with whiskers is believed attributed to deflection of cracks to the direction along whiskers, a pull-out effect of whiskers, a bridging effect of whiskers, and the like. However, where whiskers are merely dispersed in a matrix, both are reacted with each other on their interface to be firmly bonded to each other. In such a state, no substantial pull-out effect is produced when stress is imposed, only resulting in cutting of the whiskers, and no improvement in strength and toughness can be obtained.

In order to endow a whisker-reinforced ceramic composite material with further improved toughness, it is considered effective to control an interfacial reaction between a ceramic matrix and a whisker reinforcement. Coating of whiskers with a different substance has been studied in this direction. For example, JP-A-1-133981 discloses coating of SiC whiskers with partially stabilized $ZrO_2$ by a CVD method.

As above exemplified, coating of a metal oxide on whiskers has conventionally been carried out by gas phase synthetic processes, e.g., a CVD method and a sputtering method. According to these processes, however, since deposition of a gaseous phase metal oxide shows directionality, it is difficult to coat the back side of whiskers. In other words, it has been very difficult to form a uniform coating on the entire surface of whiskers. Thus, ceramic composite materials reinforced with conventional metal oxide-coated whiskers do not undergo sufficient improvement on toughness and still lack reliability.

In addition, coating by gas phase synthetic processes is unsuitable for mass production and uneconomical because it requires a specially designed film-forming device and complicated and strictly controlled conditions or operations and also because the amount of whiskers which can be coated at a time is limited by the size of the film-forming device.

For example, it has been proposed to coat BN or C on the surface of SiC whiskers to provide a reaction inhibitory layer on the interface between the SiC whiskers and an $Si_3N_4$ matrix as disclosed in JP-A-1-179762. According to this proposal, it is expected that the reaction between SiC whiskers and the $Si_3N_4$ matrix can be inhibited by the carbide, nitride or carbon layer provided on the whiskers to reduce interfacial bonding strength, thereby obtaining a marked pull-out effect of the whiskers. Notwithstanding, it turned out that sufficient improvements in toughness and strength which would have resulted cannot be necessarily obtained.

SUMMARY OF THE INVENTION

An object of the present invention is to provide a highly reliable SiC whisker-reinforced $Si_3N_4$ composite material having high toughness and excellent strength, particularly high-temperature strength.

Another object of the present invention is to provide a process for producing a highly reliable SiC whisker-reinforced $Si_3N_4$ composite material in which the state of the interface between SiC whiskers and an $Si_3N_4$ matrix is properly controlled to improve strength and toughness.

A further object of the present invention is to provide a process for forming a uniform metal oxide coating on the entire surface of whiskers as a reinforcement for ceramics, which process is simple, easy, and suitable for mass production.

The above objects of the present invention are accomplished by the following three embodiments.

A first embodiment of the present invention relates to an SiC whisker-reinforced $Si_3N_4$ composite material comprising a sintered body of an $Si_3N_4$ matrix having dispersed therein SiC whiskers, wherein said SiC whiskers are uniaxially orientated.

The SiC whisker-reinforced $Si_3N_4$ composite material according to the first embodiment is preferably produced by a process comprising sheeting a slurry containing $Si_3N_4$ powder and SiC whiskers by using a doctor blade to prepare a green sheet, laminating a plurality of the resulting green sheets with the orientation direction of the SiC whiskers being in parallel, and hot-press sintering or pressure sintering the parallel laminate in nitrogen gas.

A second embodiment of the present invention relates to a process for producing an SiC whisker-reinforced $Si_3N_4$ composite material which comprises mixing (1) SiC whiskers having a coating comprising an oxide of at least one metallic element selected from the group consisting of Be, Mg, Ca, Sr, and Ba of the group 2A; Sc, Y, and La of the group 3A; Ti, Zr, and Hf of the group 4A; and Li, Al, and Si with (2) $Si_3N_4$ powder, and sintering the mixture.

A third embodiment of the present invention relates to a process for forming a metal oxide coating on the surface of whiskers useful as a reinforcement for ceramics, which comprises dipping whiskers in a solution of an inorganic or organic salt of at least one metallic element selected from the group consisting of the elements of the groups 2A, 3A, and 4A of the periodic table, Li, and Al and heat treating the whiskers having adhered thereto the metallic salt at a temperature not less than the thermal decomposition temperature of said metallic salt.

DETAILED DESCRIPTION OF THE INVENTION

The first embodiment of the present invention is explained below.

One of the causes leaving conventional SiC whisker-reinforced $Si_3N_4$ composite materials still unsatisfactory in their toughness and high-temperature strength is believed to consist in dispersion of the orientation direction of whiskers. In conventional SiC whisker-reinforced $Si_3N_4$ composite materials, SiC whiskers are dispersed at random in the matrix so that they fail to exhibit a great resisting force against cracking planes propagating on fracture. Further, where a composite material is produced by general molding techniques, such as press molding and CIP molding, it has been difficult to completely prevent whiskers from agglomerating due to entanglement. It follows that whiskers cannot be dispersed at a high density and that agglomerates of whiskers are ready to become starting points of fracture.

According to the first embodiment, on the contrary, whiskers in a slurry containing $Si_3N_4$ powder and SiC whiskers can be orientated along a pull-out direction by sheeting the slurry with a doctor blade. The resulting green sheets are laminated in such a manner that the whiskers have the same orientation direction and then sintered to obtain an SiC whisker-reinforced $Si_3N_4$ composite material having the whiskers uniaxially orientated.

The composite material having whiskers uniaxially orientated has a great resisting force against propagation of cracking planes perpendicular to the orientation direction of the whiskers. Accordingly, when the SiC whisker-reinforced $Si_3N_4$ composite material of the present invention is used as a structural material, etc., in such a manner that the orientation direction of whiskers may intersect the propagation direction of cracking planes, it is possible to draw an appreciable pinning effect from the whiskers to obtain a markedly improved high-temperature strength as well as to draw a crack deflection effect and a pull-out effect which make a great contribution to a considerable improvement in fracture toughness.

In the production of the composite material of the first embodiment, the slurry comprising $Si_3N_4$ powder and SiC whiskers contains an organic binder as usual in an amount of from 10 to 30% by weight. After adjusting the viscosity by means of a deaerator, etc., the slurry is sheeted by doctor blade coating. A suitable viscosity of the slurry ranges from 500 to 10,000 cps, and preferably from 800 to 3,000 cps. Slurries having a viscosity out of the above range are difficult to sheet. That is, if the viscosity is less than 500 cps, it is difficult to obtain a sheet of uniform thickness under thickness control. If it exceeds 10,000 cps, the slurry has poor moldability due to lack of fluidity.

Green sheets formed by doctor blade coating preferably have a thickness ranging from 0.01 to 3 mm, and particularly from 0.2 to 0.5 mm. Too thin green sheets of less than 0.01 mm are liable to be torn and also need much labor for preparing a laminate of a prescribed thickness. If the thickness exceeds 3 mm, orientation properties of whiskers are disturbed.

A plurality of the green sheets are laminated, and the laminate is heat-treated in the atmosphere preferably at a temperature of from 500° to 900° C. to thereby remove any organic binders and then subjected to hot-press or pressure sintering in nitrogen gas. Sintering is preferably carried out at a temperature of from 1,600° to 1,950° C. under a hot-press pressure of from 100 to 400 $kg/cm^2$. Alternatively, the green sheet laminate may be hot bonded by means of a laminating press, preferably at a temperature of from 40° to 80° C. under a pressure of from 20 to 50 $kg/cm^2$ for a period of from 2 to 8 minutes.

The size of SiC whiskers and the amount of SiC whiskers to be compounded are selected in a conventional manner. In general, whiskers of 0.1 to 3.0 $\mu m$ in diameter and of 2 to 200 $\mu m$ in length are preferably used, and the amount of whiskers to be compounded is preferably from 1.0 to 60 parts by weight per 100 parts by weight of $Si_3N_4$ powder.

The second embodiment according to the present invention is explained below.

SiC whiskers which can be used in the second embodiment may be selected from commercially available products. Whiskers of 0.1 to 10 $\mu m$ in diameter and 5 to 50 $\mu m$ in length are generally used.

While formation of a coating on the surface of whiskers is generally carried out by gas phase synthetic processes as mentioned above, a metallic oxide coating according to the second embodiment is preferably formed by utilizing thermal decomposition of an organic or inorganic salt of the specific metallic element, i.e., the process according to the third embodiment of the present invention hereinafter described.

The whisker-reinforced $Si_3N_4$ composite material of the second embodiment can be obtained by mixing SiC whiskers having thereon a metal oxide coating with $Si_3N_4$ powder and molding and sintering the mixture in a known manner.

For improving toughness and strength through a pull-out effect, etc., of whiskers dispersed in a matrix, the quantity of absorption energy on pulling out turned out to be of great importance. That is, if the interfacial bonding force between whiskers and the matrix is too high, it merely follows that the whiskers are cut without producing any pull-out effect, and no large absorption energy is obtained. To the contrary, with too weak a interfacial bonding force, the whiskers are easily pulled out but, in turn, the absorption energy on pulling becomes small, failing to obtain a desired improvement in toughness.

The whiskers used in the second embodiment have on the surface thereof a coating comprising an oxide of at least one metallic element selected from the group consisting of Be, Mg, Ca, Sr, and Ba of the group 2A; Sc, Y, and La of the group 3A; Ti, Zr, and Hf of the group 4A; Li, Al, and Si. These metal oxides are reacted with both the surface of SiC whiskers and $Si_3N_4$ particles on sintering to form a fourth or higher order layer between the whiskers and the matrix. The thus formed layer imparts a moderate bonding strength to the interface between the SiC whiskers and the $Si_3N_4$ matrix and, at the same time, alleviates a difference in stress imposed on the interface due to a difference in coefficient of thermal expansion between the whiskers and the matrix. Sintering is preferably conducted in a non-oxidative or reducing atmosphere.

A part of the metal oxide on the whisker surface becomes a liquid phase on sintering to serve as a sintering assistant. As a result, affinity between SiC whiskers and the matrix can be improved and, also, sintering in the vicinities of the whiskers can be accelerated, to thereby provide a dense sintered body while containing therein whiskers. Thus, the composite material according to the present invention shows great improvements in strength and toughness resulting from these effects.

For achieving the above-described effects, the metal oxide coating preferably has a thickness of from 0.3 nm to 5 $\mu$m. A coating thickness of less than 0.3 nm produces poor interfacial bonding strength, failing to obtain desired effects on improvement of toughness. If the thickness exceeds 5 $\mu$m, toughness tends to be reduced due to excessive influence of the metal oxide. The thickness of the metal oxide coating can be easily controlled by varying the concentration of a metallic salt solution.

The composite material produced by the second embodiment preferably has an SiC whisker content of from 1 to 60% by volume. If the whisker content is less than 1% by volume, the expected effects of whisker addition cannot be obtained. If it exceeds 60% by volume, sintering becomes difficult.

The third embodiment of the present invention will be explained below.

The whiskers which can be used in this embodiment include those conventionally employed as a reinforcement in ceramic composite materials, such as $Al_2O_3$, SiC, and $Si_3N_4$.

Organic or inorganic metallic salts which can be used are not particularly limited as long as they can be converted to an oxide upon thermal decomposition. From the viewpoint of ease in thermal decomposition, inorganic salts of the above-mentioned metallic element and nitric acid, sulfuric acid, phosphoric acid or a hydrogen halide and organic salts of the above-mentioned metallic element and a fatty acid having from 3 to 30 carbon atoms are preferred.

In the process according to the third embodiment, an organic or inorganic salt of a specific metallic element is thermally decomposed to form a metal oxide coating on the surface of the whiskers. The process can be carried out by dipping the whiskers in a solution of an organic or inorganic metallic salt in water or an organic solvent to uniformly adhere the metallic salt on the entire surface of the whiskers, drying the whiskers, and heating the whiskers to the thermal decomposition temperature of the metallic salt or higher temperatures. Thus, a metal oxide coating can easily be formed on the whisker surface without changing the state of the coating.

Since the state of adhesion of the metallic salt onto the whiskers has a great influence on the form or state of the resulting metal oxide coating, care should be taken to wet the entire surface of the whiskers with the metallic salt solution. To this end, it is desirable that the solution be agitated while applying ultrasonic waves so that the whiskers may be thoroughly untangled in the solution.

The heating temperature for converting the organic or inorganic metallic salt to the corresponding metal oxide usually ranges from 200° to 2,000° C., and preferably from 300° to 1,000° C., in the atmosphere, though varying depending on the kind of the metallic salt.

The resulting metal oxide coating preferably has a thickness between 0.3 nm and 5 $\mu$m. If the thickness is less than 0.3 nm, no effects of the coating in improving toughness can be produced. If it exceeds 5 $\mu$m, toughness tends to be reduced due to too large an influence of the metal oxide. The thickness of the metal oxide coating can be arbitrarily and easily controlled by changing the concentration of the metallic salt solution.

The present invention is now illustrated in greater detail with reference to the following Examples and Comparative Examples, but it should be understood that the present invention is not deemed to be limited thereto. All the percents, parts, and ratios are by weight unless otherwise specified.

EXAMPLE 1

120 g of SiC whiskers (having been classified through a 200 mesh sieve) having a diameter of 0.5 $\mu$m and a length of 15 $\mu$m was added to 480 g of $Si_3N_4$ powder containing 8.4% of $Y_2O_3$ and 2.0% of $Al_2O_3$ as sintering assistants. The mixture was mixed in 1.5 l of ethanol for 2 hours. 60 g of polyvinyl butyral and 40 g of di-n-butyl phthalate were added thereto as organic binders, and the mixing was further continued for 4 hours. The resulting slurry was adjusted to have a viscosity of 850 cps in a deaerator and then sheeted by using a doctor blade coater to obtain a 0.3 mm thick green sheet. After evaporating ethanol by spontaneous drying, the green sheet was observed under a scanning electron microscope. It was found that the SiC whiskers were uniaxially orientated in the moving direction of the doctor blade.

The green sheet was cut to 100×100 mm squares. Fifteen cut sheets were laminated in such a manner that the whiskers in the sheets had the same orientation direction, and the laminate was press bonded by means of a laminating press at 40° C. and 20 kg/cm² for 3 minutes. The resulting laminate was heat treated in the atmosphere at 600° C. for 2 hours to remove the organic binders and then sintered by hot pressing at 1700° C. and 200 kg/cm² for 2 hours in nitrogen gas.

Species of a JIS size were cut out of the resulting sintered body, and room-temperature strength ($\sigma_{rt}$), strength at 1250° C. in $N_2$ ($\sigma_{1250}$), and fracture toughness by an SENB method ($K_{IC}$) were measured. As a result, $\sigma_{rt}=110$ kg/mm²; $\sigma_{1250}=120$ kg/mm²; and $K_{IC}=9.6$ MPam$^{\frac{1}{2}}$, proving that the sample had high strength and high toughness, particularly high strength at a high temperature. Observation of the specimen under a scanning electron microscope revealed that the SiC whiskers were uniaxially orientated in the $Si_3N_4$ matrix.

EXAMPLE 2

A sintered body was produced in the same manner as in Example 1, except for varying the diameter and length (D-L) of the SiC whiskers, the amount of the whiskers to be added to $Si_3N_4$ powder, and the thickness of the green sheet as shown in Table 1 below. Mechanical properties of the resulting sample were measured in the same manner as in Example 1, and the results obtained are also shown in Table 1.

TABLE 1

| Sample No. | D-L of Whiskers ($\mu$m) | Amount of Whiskers (part*) | Thickness of Green Sheet (mm) | Strength Room Temp. (kg/mm$^2$) | Strength 1250° C. (kg/mm$^2$) | $K_{IC}$ (MPam$^{\frac{1}{2}}$) |
| --- | --- | --- | --- | --- | --- | --- |
| 1  | 0.2–10   | 2  | 0.05 | 100 | 101 | 8.7  |
| 2  | 2.0–50   | 10 | 0.05 | 120 | 125 | 8.9  |
| 3  | 3.0–50   | 50 | 0.05 | 96  | 115 | 9.8  |
| 4  | 0.2–10   | 10 | 0.1  | 141 | 121 | 10.8 |
| 5  | 2.0–50   | 50 | 0.1  | 101 | 148 | 10.1 |
| 6  | 3.0–150  | 50 | 0.1  | 92  | 101 | 10.0 |
| 7  | 0.5–15   | 20 | 0.3  | 110 | 120 | 9.6  |
| 8  | 2.0–50   | 10 | 0.3  | 131 | 158 | 10.8 |
| 9  | 3.0–150  | 2  | 0.3  | 125 | 135 | 11.5 |
| 10 | 0.2–10   | 20 | 1.0  | 119 | 106 | 9.5  |
| 11 | 2.0–50   | 20 | 1.0  | 130 | 125 | 12.5 |
| 12 | 3.0–150  | 10 | 1.0  | 86  | 75  | 11.8 |
| 13 | 2.0–15   | 50 | 2.0  | 121 | 112 | 13.2 |
| 14 | 3.0–150  | 20 | 2.0  | 131 | 98  | 14.1 |
| 15 | 3.0–150  | 2  | 2.0  | 109 | 133 | 8.8  |

Note:
*Per 100 parts of Si$_3$N$_4$ powder.

EXAMPLE 3

120 g of SiC whiskers having a diameter of about 0.5 $\mu$m and a length of about 15 $\mu$m was dipped in 1.2 l of a 100 g/l solution of aluminum stearate in ethanol and thoroughly dispersed and mixed. The SiC whiskers were taken out by filtration and spontaneously dried to evaporate ethanol. The whiskers were then heated at 900° C. in the atmosphere for 2 hours to thermally decompose the aluminum stearate adhered on the surface to form a coating comprising Al$_2$O$_3$ and having a thickness of about 80 Å.

The Al$_2$O$_3$-coated SiC whiskers and Si$_3$N$_4$ powder containing small amounts of Y$_2$O$_3$ and Al$_2$O$_3$ as sintering assistants were wet blended at a mixing ratio of 1:4, and the resulting slurry was molded by filtration by suction to obtain a sheet. Four or five sheets of the molded product were laminated and sintered by hot pressing at 1700° C. and 200 kg/cm$^2$ for 2 hours in nitrogen.

Specimens of a JIS size were cut out of the sintered body, and strength and toughness of the specimen were measured. As a result, $\sigma_f$=1100 MPa and $K_{IC}$=11 MPam$^{\frac{1}{2}}$, indicating great improvements in both strength and toughness over those of an Si$_3$N$_4$ single substance ($\sigma_f$=900 MPa; $K_{IC}$=7.0 MPam$^{\frac{1}{2}}$).

TEM observation of the structure of the sintered body revealed a reaction layer in the interface between the SiC whiskers and the Si$_3$N$_4$ matrix, proving the change in interfacial bonding strength therebetween.

EXAMPLE 4

110 g of SiC whiskers having a diameter of about 0.5 $\mu$m and a length of about 15 $\mu$m was dipped in 1.2 l of a 110 g/l solution of yttrium stearate in ethanol and thoroughly dispersed and mixed. The SiC whiskers were taken out by filtration and spontaneously dried to evaporate ethanol. The whiskers were then heated at 800° C. in the atmosphere for 2 hours to thermally decompose the yttrium stearate adhered on the surface to form a coating comprising Y$_2$O$_3$ and having a thickness of about 100 Å.

The Y$_2$O$_3$-coated SiC whiskers and Si$_3$N$_4$ powder containing small amounts of Y$_2$O$_3$ and Al$_2$O$_3$ as sintering assistants were wet blended at a mixing ratio of 3:7, and the resulting slurry was molded by filtration by suction to obtain a sheet. Four or five sheets of the molded product were laminated and sintered by hot pressing at 1750° C. and 200 kg/cm$^2$ for 2 hours in nitrogen.

Specimens of a JIS size were cut out of the sintered body, and strength and toughness of the specimen were measured. As a result, $\sigma_f$=1050 MPa and $K_{IC}$=10 MPam$^{\frac{1}{2}}$, indicating great improvements in both strength and toughness over those of an Si$_3$N$_4$ single substance ($\sigma_f$=900 MPa; $K_{IC}$=7.0 MPam$^{\frac{1}{2}}$).

TEM observation of the structure of the sintered body revealed a reaction layer in the interface between the SiC whiskers and the Si$_3$N$_4$ matrix, proving the change in interfacial bond strength therebetween.

EXAMPLE 5

120 g of SiC whiskers having a diameter of about 1.0 $\mu$m and a length of about 30 $\mu$m was dipped in 1.2 l of a 70 g/l solution of zirconium nitrate in ethanol and thoroughly dispersed and mixed. The SiC whiskers were taken out by filtration and spontaneously dried to evaporate ethanol. The whiskers were then heated at 600° C. in the atmosphere for 2 hours to thermally decompose the zirconium nitrate adhered on the surface to form a coating comprising ZrO$_2$ and having a thickness of about 100 Å.

The ZrO$_2$-coated SiC whiskers and Si$_3$N$_4$ powder containing small amounts of Y$_2$O$_3$ and Al$_2$O$_3$ as sintering assistants were wet blended at a mixing ratio of 1:4, and the resulting slurry was molded by filtration by suction to obtain a sheet. Four or five sheets of the molded product were laminated and sintered by hot pressing at 1700° C. and 200 kg/cm$^2$ for 2 hours in nitrogen.

Specimens of a JIS size were cut out of the sintered body, and strength and toughness of the specimen were measured. As a result, $\sigma_f$=1100 MPa and $K_{IC}$=10.5 MPam$^{\frac{1}{2}}$, indicating great improvements in both strength and toughness over those of an Si$_3$N$_4$ single substance ($\sigma_f$=900 MPa; $K_{IC}$=7.0 MPam$^{\frac{1}{2}}$).

TEM observation of the structure of the sintered body revealed a reaction layer in the interface between the SiC whiskers and the Si$_3$N$_4$ matrix, proving the change in interfacial bond strength therebetween.

EXAMPLE 6

120 g of SiC whiskers having a diameter of about 0.5 $\mu$m and a length of about 10 $\mu$m was dipped in 1.2 l of a 80 g/l solution of hafnium nitrate in ethanol and thoroughly dispersed and mixed. The SiC whiskers were taken out by filtration and spontaneously dried to evaporate ethanol. The whiskers were then heated at 700° C. in the atmosphere for 2 hours to thermally decompose the hafnium nitrate adhered on the surface to form a coating comprising $Hf_2O_3$ and having a thickness of about 200 Å.

The $Hf_2O_3$-coated SiC whiskers and $Si_3N_4$ powder containing small amounts of $Y_2O_3$ and $Al_2O_3$ as sintering assistants were wet blended at a mixing ratio of 1:4, and the resulting slurry was molded by filtration by suction to obtain a sheet. Four or five sheets of the molded product were laminated and sintered by hot pressing at 1700° C. and 200 kg/cm² for 2 hours in nitrogen.

Specimens of a JIS size were cut out of the sintered body, and strength and toughness of the specimen were measured. As a result, $\sigma_f = 1200$ MPa and $K_{IC} = 13$ MPam$^{\frac{1}{2}}$, indicating great improvements in both strength and toughness over those of an $Si_3N_4$ single substance ($\sigma_f = 900$ MPa; $K_{IC} = 7.0$ MPam$^{\frac{1}{2}}$).

TEM observation of the structure of the sintered body revealed a reaction layer in the interface between the SiC whiskers and the $Si_3N_4$ matrix, proving the change in interfacial bond strength therebetween.

EXAMPLE 7

120 g of SiC whiskers having a diameter of about 0.5 μm and a length of about 15 μm was dipped in 1.2 l of a 70 g/l solution of $Al(NO_3)_3.9H_2O$ in ethanol, and the solution was stirred under ultrasonic irradiation to thoroughly untangle the whiskers. The whiskers were taken out by filtration and spontaneously dried to evaporate ethanol. The SiC whiskers were then heated at 350° C. in the atmosphere for 2 hours to thermally decompose $Al(NO_3)_3.9H_2O$ adhered on the surface to form $Al_2O_3$.

The resulting SiC whiskers were analyzed by X-ray diffractometry and observed under a scanning electron microscope. It was found, as a result, that the entire surface of the SiC whiskers was coated with $Al_2O_3$ to an average thickness of 80 Å.

20% of the resulting $Al_2O_3$-coated SiC whiskers, 69.6% of $Si_3N_4$ powder, 6.7% of $Y_2O_3$ powder, and 1.7% of $Al_2O_3$ powder were wet blended, and the blend was molded in a usual manner. The molded article was sintered by hot pressing at 1700° C. and 200 kg/cm².

The resulting sintered body had a bending strength of 110 kg/mm² and a $K_{IC}$ toughness of 11 MN/m$^{2/2}$, proving extremely tough.

EXAMPLE 8

120 g of SiC whiskers having a diameter of about 0.5 μm and a length of about 15 μm was dipped in 1.2 l of a 33 g/l solution of $Zr(NO_3)_2.2H_2O$ in ethanol. Thereafter, the same procedures as in Example 7 were followed, and the thus treated SiC whiskers were heated at 900° C. in the atmosphere for 2 hours to thermally decompose $Zr(NO_3)_2 2H_2O$ adhered on the surface to form $ZrO_2$.

The resulting whiskers were analyzed and observed in the same manner as in Example 7 and, as a result, it was found that the entire surface of the SiC whiskers was coated with $ZrO_2$ to an average thickness of 100 Å.

As described and demonstrated above, the first embodiment of the present invention provides a highly reliable SiC whisker-reinforced $Si_3N_4$ composite material having high toughness and high strength, particularly high strength at high temperatures, in which SiC whiskers are uniaxially orientated in the $Si_3N_4$ matrix. The composite material is therefore particularly promising as a high-temperature material for gas turbine engines or automobile engines.

According to the second embodiment of the present invention, the interfacial state between SiC whiskers and an $Si_3N_4$ matrix can be controlled so as to have an adequate interfacial bonding force by providing a metal oxide coating on the surface of the SiC whiskers to thereby produce a whisker-reinforced $Si_3N_4$ composite material having high strength and greatly improved toughness. Overcoming the problem of brittleness of ceramics, the process provides a highly reliable ceramic composite material which can be expected to be applied to various mechanical structural parts such as automobile engines.

According to the third embodiment of the present invention, a metal oxide coating can be uniformly formed on the entire surface of whiskers as a reinforcement in ceramic composite materials. The process can be carried out in a simple manner without requiring any special apparatus or complicated operations. Moreover, the process makes it feasible to treat a large quantity of whiskers at one time and is therefore excellent in mass productivity and economy. The whiskers having thereon a uniform metal oxide coating as produced by the process, when used as a reinforcement in the production of whisker-reinforced ceramic composite materials, can control an interfacial reaction with a ceramic matrix to thereby surely improve toughness of the ceramic material to a considerably high level. Such whisker-reinforced ceramic composite materials are promising for application to various mechanical structural parts.

While the invention has been described in detail and with reference to specific examples thereof, it will be apparent to one skilled in the art that various changes and modifications can be made therein without departing from the spirit and scope thereof.

What is claimed is:

1. A process for producing an SiC whisker-reinforced $Si_3N_4$ composite material which comprises mixing (1) SiC whiskers having a length of from 2 to 200 pm and a coating comprising an oxide of at least one element selected from the group consisting of Be, Mg, Ca, Sr, Ba, Sc, Y, La, Ti, Zr, Hf, Li, Al, and Si with (2) $Si_3N_4$ powder to form a mixture of the SiC whiskers and the $Si_3N_4$ powder, wherein the coating covers the whole surface of a SiC whisker and the coating has a uniform thickness of from 0.0003 to 5 μm and the coating is formed by dipping the SiC whiskers in a solution of an inorganic or organic salt of at least one element selected from Be, Mg, Ca, Sr, Ba, Sc, Y, La, Ti, Zr, Hf, Li, Al, and Si; sheeting the mixture of (1) SiC whiskers and (2) $Si_3N_4$ powder using a doctor blade to prepare a green sheet having a thickness of from 0.01 to 3 mm plurality of the resulting green sheets with the orientation direction of the SiC whiskers being parallel to each other, to form a laminate of the plurality of the green sheets and sintering the laminate of the plurality of the green sheets.

2. A process as claimed in claim 1, wherein said SiC whisker-reinforced $Si_3N_4$ composite material contains from 1 to 60% by volume of the SiC whiskers.

* * * * *